US010145743B2

(12) United States Patent
Timofeev et al.

(10) Patent No.: US 10,145,743 B2
(45) Date of Patent: Dec. 4, 2018

(54) SUPERCONDUCTING THERMAL DETECTOR (BOLOMETER) OF TERAHERTZ (SUB-MILLIMETER WAVE) RADIATION

(71) Applicant: Teknologian tutkimuskeskus VTT Oy, Espoo (FI)

(72) Inventors: Andrey Timofeev, Espoo (FI); Juha Hassel, Espoo (FI); Arttu Luukanen, Helsinki (FI); Panu Helistö, Espoo (FI); Leif Grönberg, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 301 days.

(21) Appl. No.: 14/773,359

(22) PCT Filed: Mar. 4, 2014

(86) PCT No.: PCT/FI2014/050158
§ 371 (c)(1),
(2) Date: Sep. 7, 2015

(87) PCT Pub. No.: WO2014/135749
PCT Pub. Date: Sep. 12, 2014

(65) Prior Publication Data
US 2016/0018267 A1    Jan. 21, 2016

(30) Foreign Application Priority Data
Mar. 5, 2013  (FI) ...................................... 20135212

(51) Int. Cl.
*G01J 5/20*    (2006.01)
*G01J 5/02*    (2006.01)
(Continued)

(52) U.S. Cl.
CPC .................. *G01J 5/20* (2013.01); *G01J 5/024* (2013.01); *H01L 37/00* (2013.01); *G01J 2005/106* (2013.01); *G01J 2005/208* (2013.01)

(58) Field of Classification Search
CPC ........ G01J 5/20; G01J 5/024; G01J 2005/208; G01J 2005/106; H01L 37/00
(Continued)

(56) References Cited

U.S. PATENT DOCUMENTS 5,604,375 A * 2/1997 Findikoglu ............. H01P 1/203
                                                    257/661
5,634,718 A  6/1997 Martinis et al.
(Continued)

FOREIGN PATENT DOCUMENTS

CN    101881668 A    11/2010

OTHER PUBLICATIONS

D.P. Osterman et al., "Antenna-coupled bolometer with a micromachined-beam thermal link", Appl. Phys Lett. 71 (16) Oct. 20, 1997.
(Continued)

*Primary Examiner* — David Porta
*Assistant Examiner* — Gisselle Gutierrez
(74) *Attorney, Agent, or Firm* — Seppo Laine Oy

(57) ABSTRACT

A superconducting thermal detector (bolometer) of THz (sub-millimeter) wave radiation based on sensing the change in the amplitude or phase of a resonator circuit, consisting of a capacitor (Csh) and a superconducting temperature dependent inductor where the said inductor is thermally isolated from the heat bath (chip substrate) by micro-suspensions. The bolometer design includes a thin film inductor located on the membrane, a single or/and multi-layered thin film capacitor, and a thin film absorber of incoming radiation. The bolometer design can also include a lithographic
(Continued)

antenna with antenna termination and/or a back reflector beneath the membrane for optimal wavelength detection by the resonance circuit. The superconducting thermal detector (bolometer) and arrays of these detectors operate in a temperature range from 1 Kelvin to 10 Kelvin.

9 Claims, 5 Drawing Sheets

(51) Int. Cl.
  *H01L 37/00* (2006.01)
  *G01J 5/10* (2006.01)
(58) Field of Classification Search
  USPC .................................................... 250/336.2
  See application file for complete search history.

(56) References Cited

U.S. PATENT DOCUMENTS

| | | |
|---|---|---|
| 6,292,140 B1 | 9/2001 | Osterman |
| 7,030,453 B1 | 4/2006 | Agnese |
| 2004/0021466 A1* | 2/2004 | Hammond ........ G01R 33/34023 |
| | | 324/318 |
| 2004/0140429 A1 | 7/2004 | Jack et al. |
| 2006/0076493 A1 | 4/2006 | Bluzer |
| 2011/0002359 A1 | 1/2011 | Benzel et al. |
| 2011/0228809 A1 | 9/2011 | Tadigadapa |
| 2013/0022077 A1* | 1/2013 | Harmon ................... G01J 5/20 |
| | | 374/178 |
| 2015/0293236 A1* | 10/2015 | Cecil ..................... G01T 1/1606 |
| | | 505/161 |
| 2016/0018267 A1* | 1/2016 | Timofeev ................ G01J 5/024 |
| | | 250/336.2 |
| 2016/0290868 A1* | 10/2016 | Gunnarsson ............ H01L 39/22 |
| 2016/0335559 A1* | 11/2016 | Pereverzev ................ C22C 5/04 |

OTHER PUBLICATIONS

Doyle S et al: Superconducting Lumped Element Kinetic Inductance resonators for millimeter, sub-millimeter and far infrared detection. May 9, 2010.
E.N. Grossman et al: IEEE TRANS. On Magnetics, vol. 27. Mar. 1991.
Jonas Zmuidzinas: Superconducting Microresonators: Physics and Applications.Jan. 2, 2012.

* cited by examiner

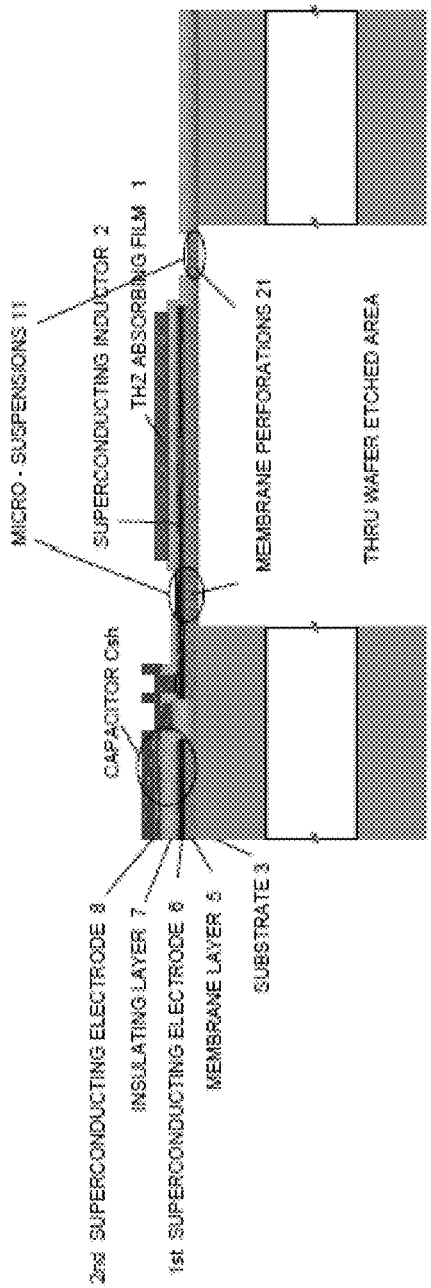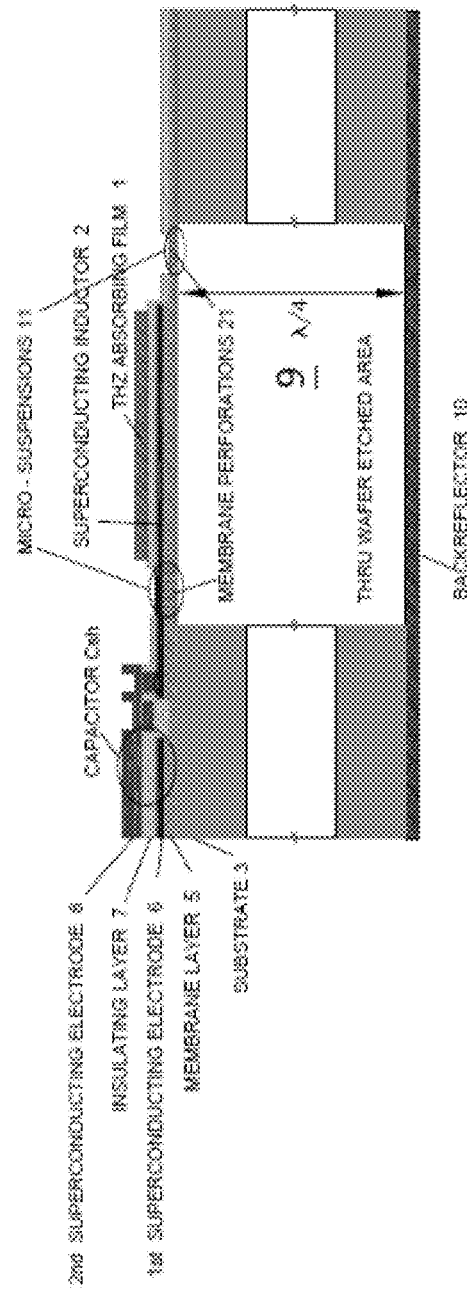

SUPERCONDUCTING THERMAL DETECTOR (BOLOMETER) OF TERAHERTZ (SUB-MILLIMETER WAVE) RADIATION

FIELD OF THE INVENTION

The present invention relates to a superconducting thermal detector according to the preamble of claim 1.

The invention also relates to a manufacturing method.

The invention relates also to design, fabrication, readout techniques of a superconducting thermal detector and design and methods of microwave multiplexed read-out of the arrays of superconducting thermal detectors.

The present invention relates also to a detector which detects electromagnetic waves at Terahertz (THz) frequencies, and more particularly to a superconducting bolometer type Terahertz wave detector.

BACKGROUND OF THE INVENTION

Thermal detectors (bolometers) have been first introduced by S. P. Langley back in 1880. The operating principle of the bolometer is based on detection a small temperature change with a sensitive thermometer, whereby the said temperature change is caused due to a heat into which the absorbed radiation is transformed in the bolometer absorbing element (FIG. 1). For sensitivity, the thermometer is isolated from the thermal reservoir through a thermal link with a thermal conductance G. Thermal detectors with superconducting materials (transition edge sensors (TES's)) based on sharp temperature dependence of the resistance within the superconducting transition have been first proposed in late 1930's [D. H. Andrews, Yearbook—Am. Philos. Soc. (1938), 132; A. Goetz, Phys. Rev. 55, 1270, 1939] and demonstrated in early 1940's [D. H. Andrews et al., Phys. Rev. 59, 1045, 1941]. In late 1980's D. G. McDonald proposed [Applied Physics Letters, Vol. 50, p. 775, 1987] and demonstrated shortly after a superconducting bolometer based on kinetic inductance of a superconducting microstrip line [IEEE Trans. on Magnetics, Vol. 25, No. 2, 1989]. Its operation is based on strong temperature T dependence of the kinetic inductance near the transition temperature T of a superconductor ($T<T_C$).

RELATED PATENT DOCUMENT

Also known in the prior art is Donald G. McDonald, U.S. Pat. No. 4,869,598, issued Sep. 26 1989 (which has an expired status at 2012), which is said to disclose a temperature-sensitive superconducting device comprising a sensor having a geometry with at least two operationally interacting spaced superconducting thin film layers separated by dielectric, wherein the said sensor has a temperature dependent kinetic inductance based upon a magnetic penetration depth. Among the number of disclosed devices based on the said sensor in this invention, it is said to disclose the device based on utilizing said sensor to receive said temperature indicative output; the device utilizing said sensor used as a variable inductance for electronic circuit means; the device with electronic circuit means including oscillation means providing an output frequency varying due to temperature dependent inductance, whereby the output frequency of said oscillations means is temperature dependent; the device of claim 1 including means for connecting said sensor with monitoring means capable of monitoring at least one of power and radiation whereby said device produces a temperature-indicative output that is indicative of at least one of power and radiation monitored by said monitor means; superconductor-based detection devices comprising absorbing elements of at least one of power and radiation.

FURTHER PRIOR ART

First Implementation of Far-Infrared (THZ) Kinetic Inductance Bolometers

The first demonstration of kinetic inductance bolometers with coupled antenna absorber by using SQUID read-out scheme was carried out in 1991 by E. N. Grossman, D. G. McDonald and J. E. Sauvageau [see IEEE Trans. On Magnetics, Vol. 27, No. 2, Mar 1991, 2677-2680; 2757-2760]. Multiplexable Microwave Kinetic Inductance THZ Detectors Recently introduced microwave kinetic inductance detectors opened possibility to build multi-pixel superconducting THz imaging arrays with hundreds of pixel readout out only with a single pair of coaxial lines. Below in the text we give a brief overview of these detectors.

KID

In 2003 P. K. Day et al [Nature, Vol. 425, p. 817, 2003, (Ref. 4)] demonstrated kinetic inductance detector (KID) operating in non-equilibrium mode at temperatures T much below the transition temperature $T_C$ ($T<<T_C$). The microscopic physical mechanism of KID operation is based on breaking Cooper pairs into quasiparticles in a superconductor by incident photons with energies larger than twice of a superconducting gap. As a consequence, the kinetic inductance of a superconductor changes proportionally to the change of quasiparticle density caused by incident radiation. For KID, the change of kinetic inductance under irradiated optical power $P_{opt}$ can be written as $$\frac{dL_k}{dP_{opt}} = \frac{dL_k}{dN_{qp}} \frac{dN_{qp}}{dP_{opt}}$$

where $N_{qp}$ is a number of quasiparticles in a superconductor, where the incident optical power converted with optical efficiency $\eta$ into quasiparticles in a steady state is $P_{opt}=N_{qp}\Delta/\eta\tau_r$.

Here $\tau_r$ is a recombination time for quasiparticles. The performance of non-equilibrium KID is limited by generation-recombination noise with frequency $\omega$ dependent spectrum [P. K. Day, R. Barends (Ref. 5)]

$$S_{N_{qp}}(\omega) = \frac{4N_{qp}\tau_r}{1+(\omega\tau_r)^2}, \quad (1)$$

The generation-recombination noise-limited noise equivalent power of non-equilibrium KID can be written as [Karasik 2002, Day, Barends]

$$NEP_{g-r} = \sqrt{\langle P_{opt}^2\rangle/d\omega} = \sqrt{S_{N_{qp}}(1+(\omega\tau_r)^2)}\bigg/\left(\frac{dN_{qp}}{dP_{opt}}\right) = 2\frac{\Delta}{\eta}\sqrt{\frac{N_{qp}}{\tau_r}},$$

where mean square of the incident optical power $$\langle P_{opt}^2\rangle = S_{P_{opt}}d\omega = \left(\frac{dN_{qp}}{dP_{opt}}\right)^2 S_{N_{qp}}(1+(\omega\tau_r)^2)d\omega$$

is expressed through the generation-recombination noise spectrum $S_{N_{qp}}$ of the quasiparticles in a superconductor with the response time $\tau_r$.

The demonstrated by P. K. Day et al KID detector represents a superconducting quarter-wavelength transmission line resonator made out of 220 nm thick aluminium film. The read-out method of KID is based on microwave measurement of the complex impedance of a thin superconducting film. Its equivalent circuit represents a LC resonant circuit which is capacitively coupled to a transmission line. The resonant circuit consists of a capacitance and an alternated by the incident radiation inductance. The microwave current distribution is non-uniform in a KID device: it is mainly sensitive to the photon absorption in the centre of a superconducting strip, with maximal optical response at the shorted end of the quarter-wavelength resonator (and having zero response at the coupling end) [P. K. Day]. Thus, in the said KID device the optical absorber has to be coupled to the resonator's shorted end.

LEKID

As a modification of KID, in 2007 S. Doyle demonstrated lumped element kinetic inductance detector (LEKID) device [S. Doyle et al, $32^{nd}$ International Conference on Infrared and Millimeter Waves IRMMW-THz, pp. 450-451, 2007], in which the capacitance of the resonant circuit is formed by interdigital capacitor fingers. This geometrical configuration provides a uniform microwave current distribution in the resonator and the resonator itself acts both as an optical absorber and as a sensing element. The equivalent electrical circuit of LEKID device represents a series superconducting LC circuit inductively coupled to a read-out superconducting transmission line.

Superconducting Microresonator Bolometers

It has been also pointed out by Jonas Zmuidzinas in 2012 [Annu. Rev. Condens. Matter Phys. 2012. 3:169-214] that [citation taken from the text]: "Superconducting microresonators have been successfully fabricated on thermally suspended silicon nitride micromesh [personal communications with H. G. Leduc and P. K. Day, 2010], so a frequency-multiplexed array of bolometers is straightforward to produce. In a standard MKID, quasiparticle recombination provides the bottleneck for power flow, whereas in a bolometer, the bottleneck [for power flow] is set by the geometry of the thermal suspension legs. Therefore, resonator-bolometer is an interesting option when quasiparticle recombination is too rapid, e.g., at higher temperatures. In addition the thermally suspended island provides an opportunity to spread the absorbed photon energy uniformly across the inductor, which maximizes responsivity. In addition, the quasiparticle noise may be greatly reduced. Finally, the noise performance of available transistor amplifiers is considerably better than is needed to reach the fundamental sensitivity limits for bolometers (e.g., photon or phonon noise)."

Below, in chapter "Technical Description of Superconducting thermal detector (bolometer)", we present detailed theory and experimental data for fabricated arrays of superconducting thermal detectors (bolometers).

Terahertz Imaging

Imaging in the submillimetre-wave to THz spectral regions of the electromagnetic spectrum has attracted a lot of interest for various applications. In astronomical applications, cameras operating in this wavelength range can be used for mapping the Cosmic Microwave Background, interstellar gas clouds, protoplanetary disks; For Earth observation, imagery in the spectral range can be used for accurate mapping of atmospheric water vapour which is of great relevance to e.g. the greenhouse effect and also cloud formation, rainfall prediction and agriculture. In terrestrial applications the most notable so far has been the imaging of concealed items under clothing, for instance hidden weapons, explosives, drugs and other contraband. This application benefits from i) the relative good penetration of the radiation in the said wavelength range and ii) the wavelengths in general which are short enough that image forming instruments can be developed which possess an aperture diameter less than one meter.

Overview of Passive THZ Imaging Technology

Passive imaging poses challenges with respect to the receiver sensitivity, given the weakness of the (thermal) signatures. For passive systems the Planck black body emission formula indicates the signal power at 94 GHz corresponding to a 1 K level of sensitivity at an ambient temperature of 300 K is ~260 fW (in single mode, 20% relative bandwidth). Compare this with the single-mode power available in the LWIR (8-12 μm) of ~30 pW, i.e. some 2 orders of magnitude more signal power is present in the thermal infrared. Another push present both in passive and active systems is the desire to operate at higher frequencies: The angular resolution of an imaging system in proportional to the ratio of the operating wavelength to the diameter of the aperture, $\lambda/D_{ap}$. Given that end-users typically want to minimize the aperture size (and the system volume), operation at higher frequencies facilitates better angular resolution. In addition, many imaging applications including security, requires relatively large Field-of-View (FoV). Covering a large FoV with good angular resolution requires either large number of receivers (hundreds to thousands), or the combination of scanning with a smaller FPA. Due to cost, latter is often unavoidable.

The primary detector architectures employed at present for terrestrial passive THz imaging are a) Heterodyne down conversion receivers, b) pre-amplified direct detection receivers, or c) un-amplified direct detection receivers. Of these a) and c) can in principle operate up to several THz, whilst b) is limited by the poor availability of Low Noise Amplifiers (LNAs) above 300 GHz. Cost is a major issue for a) and b), while c) can be cheaper it tends to lag behind in sensitivity (at least if operated at room temperature). Recent developments are focused on pushing the LNA technology deep into the submm-wave range, but it may take some time before novel submmw LNAs become affordable. Packaging and assembly of MMIC's plays a major role here, not to mention device testing costs.

In passive imaging mode, the simultaneous requirements for sensitivity, large pixel count, large FoV and operation in the submm-wave range has motivated the development of cryogenic imaging systems. With cooling it is possible to substantially increase the sensitivity of bolometers to the point where they outperform any room temperature (even pre-amplified) detector technology. While the introduction of a closed-cycle cooling adds cost, weight, power draw and footprint to the camera back-end, the front-end is in fact less complicated than with e.g. heterodyne or preamplified direct detection architectures. Cooled systems also can leverage from the rapid development of compact cryocoolers which are now in widespread use in medical MRI machines.

An example of a cryogenic passive THz video-rate imager is the system demonstrator developed by VTT in 2010-2012. The system employs a linear array (128) of cryogenic antenna-coupled hot-spot microbolometers, each one of which is connected to a dedicated feedback preamplifier circuit. A 2D image is formed through the use of a conical scanning optical element which essentially causes the projection of each detector at the target plane to rotate a circle. A linear array of 128 detectors then draw 128 circles each slightly offset from each other in the vertical dimension. An image is generated through a software routine which interpolates the data points from the scan space to Cartesian space.

Whilst this approach can be used to build a camera as has successfully been demonstrated the approach suffers from several shortcomings: i) A linear array necessitates a (large) optomechanical scanner which increases system complexity and rises maintenance and reliability issues, ii) the dynamic range of the image is reduced due to the short dwell time per image pixel, increasing the noise bandwidth (while the information bandwidth is not increased).

Passive THz Imaging Focal Planes

A passive imager would greatly benefit from a 2D focal plane array (FPA): In order to generate an image with $N_{ip}$ image pixels with $N_{det}$ detectors ($N_{ip} > N_{det}$), there has to be $n = N_{ip}/N_{det}$ scan positions for each frame. An application typically dictates a required frame-rate $f_{frame}$. Thus the per-pixel integration time is given by $t_{int} = 1/(n \, f_{frame})$. The signal-to-noise ratio of a detector is proportional to $\sqrt{t_{int}}$ (assuming white noise). Thus, the less scanning is required to cover the needed image pixel count, the better the SNR will be.

Whilst large format FPAs are prevalent in spectral ranges beyond THz (IR, visible etc.), the THz range has yet to see the advent of large 2D FPAs. This is due to the aforementioned high costs of room-temperature detectors (primarily preamplified submm-wave direct detection receivers utilizing InP LNAs), and the unavailability of cryogenic multiplexing methods and detectors operating in the temperature range 1 K<T<10 K. The approach detailed above (parallel readout of 128 channels) does not scale to 2D arrays if using multiplexing at room temperature: each detector element in the array requires at least 2 low-impedance signal lines from the cryogenic FPA to room temperature. The conducted thermal heat load per signal wire is approximately $\dot{Q}_w = \frac{1}{2} L_0 (T_h^2 - T_c^2)/R$ where $L_0 = 2.45 \times 10^{-8}$ V$^2$/K$^2$ is the Lorentz constant, R is the average wire resistance and $T_h$ and $T_c$ are the hot and cold stage temperatures, respectively. Thus, the total parasitic conductive heat load to a 2D array with $N_{det}$ detectors is $N_{det}/2 \, L_0(T_h^2 - T_c^2)/R$, which is typically much more than the cooling overhead supplied by the cryocooler.

The invention is intended to eliminate the defects of the prior art described above and for this purpose create an entirely new type of superconducting thermal detector.

The object of the invention is a detector and readout method which allows for the construction of large format FPAs for the THz range that operate at temperatures that are readily accessible with 2-stage closed cycle cryocoolers. Similar detector arrays have been constructed for deep-cryogenic operation (T<300 mK) (NIKA [8], MAKO [8], MUSICA [10], [11]) for astrophysical applications, but due to the prohibitive cost and complexity of the associated cryogenics such systems are unusable for most terrestrial (security) applications.

The invention is based on a superconducting thermal detector (bolometer) where the thermometry is carried out by sensing the change in the amplitude or phase of a resonator circuit, consisting of a capacitor and a superconducting inductor where the said inductor is thermally isolated from the heat bath of the system (from the chip substrate).

More specifically, the sensor according to the invention is characterized by what is stated in the characterizing portions of claim 1.

Considerable advantages are gained with the aid of the invention.

The superconducting thermal detector (bolometer) in accordance with the invention operates in a temperature range from 1 Kelvin to 10 Kelvin enabling much cheaper infrastructure than the deep-cryogenic devices. On the other hand the performance of the present invention is superior to the passive (non-cryogenic) THz detectors.

SUMMARY OF THE INVENTION

This invention provides a superconducting thermal detector (bolometer) to detect THz (0.1-1 THz bandwidth) radiation. In this device, the temperature sensitive superconducting meander is thermally isolated from the thermal bath by micro-suspensions. Described in this invention superconducting THz superconducting thermal detector (bolometer) and arrays of these detectors are to be used as THz radiation sensing elements (detectors) in cryogenic THz radiation passive cameras operating in two-stage cryocooling systems.

Technical Description of Superconducting Thermal Detector (Bolometer) in Accordance with the Invention
Theory of Operation of Superconducting Thermal Detector (Bolometer)

The detector and readout system are based on a fundamental property of superconductors: kinetic inductance. Arising from the inertia of the superconducting charge carriers (Cooper pairs), superconductors exhibit inductance in excess of the geometric inductance associated with normal metals. Also normal metals do exhibit kinetic inductance, but the wavelengths where kinetic inductance in normal metals becomes relevant lies in the IR and optical wavelengths, whereas in superconductors the relevant frequency scale is in the THz region.

An important feature of the kinetic inductance $L_k$ is that it is strongly temperature T dependent: $L_k = L_k(0)/(1-(T/T_C)^4)$, where $T_C$ is the transition temperature of a superconductor, $L_k(0) \approx \mu_0 \lambda_{L(0)}^2 l/(wd)$ for a narrow thin superconducting strip, with magnetic penetration depth $\lambda_{L(0)}^2$, having a geometry of length l, width w and thickness d. Owing to this property, a kinetic inductor can be used as a thermometer to sense its physical temperature. The temperature dependent kinetic inductance is associated with the excess quasiparticle density present within the superconductor. The excess quasiparticles can be generated by either incident photons (with energy greater than twice the superconducting energy gap) or through thermal excitation. In the former case the phenomenon is commonly referred to as "non-equilibrium kinetic inductance", whereas the latter is "equilibrium kinetic inductance".

In the present invention the superconducting thermal detector is thermally isolated from the bath enabling its efficient operation in an equilibrium regime, meaning that the incident THz radiation is absorbed by the electrons of a superconductor which are in a thermal equilibrium with its phonons at temperature T. Typical temperature operation regime of such a detector lies between $\sim 0.3 T_C$ and $T_C$. The number of quasiparticles $N_{qp}$ in a superconductor with a total number of electrons N depends on temperature ($T \sim T_C$) according to a two-fluid model as:

$$N_{qp}/N = (T/T_C)^4 \qquad (2).$$

For a superconducting thermal detector with kinetic inductance $L_k$, which has thermal isolations (micro-suspensions) with thermal conductance G, the variations of the kinetic inductance under the incident optical power can be written as $$\frac{dL_k}{dP_{opt}} = \frac{1}{\eta G}\frac{dL_k}{dT}$$

assuming that the incident optical power $dP_{opt}=\eta GdT$ is absorbed with optical efficiency $\eta$ and converted into heat. For a superconducting thermal detector with thermal response time $\tau_{th}$, the generation-recombination noise-limited noise equivalent power in the equilibrium case can be written then as $$NEP^{eq}_{g-r} = \sqrt{\langle P^2_{opt}\rangle / d\omega} = \sqrt{S_{L_k}(1+(\omega\tau_{th})^2)} \Big/ \left(\frac{dL_k}{dP_{opt}}\right) = \sqrt{S_{N_{qp}}(1+(\omega\tau_r)^2)} \Big/ \left(\frac{dN_{qp}}{dP_{opt}}\right), \quad (3)$$

where $$\frac{dN_{qp}}{dP_{opt}} = \frac{4}{\eta G}N\frac{T^3}{T_C^4}, \quad (4)$$

so that using equations (1), (2), (3), and (4) from above we have $$NEP^{eq}_{g-r} = \frac{\eta GT}{2}\sqrt{\frac{\tau_r}{N_{qp}}}. \quad (5)$$

With typical numbers for G~100 nW/K at T=5 K for SiN microsuspensions, $\tau_r$<~1 ns, $N_{qp}$~$N(0)\times E_F \times Vol$~$10^{15}$ quasiparticles in the superconductor with length l~$10^{-2}$ m, width l~$10^{-6}$ m, and thickness d~$10^{-7}$ m, yielding the volume Vol=lwd~$10^{-15}$ m$^3$, and with the values (of the order of magnitude) for the density of electron states $N(0)$~$10^{47}$ m$^{-3}$J$^{-1}$ and fermi energy $E_F$~$10^{-18}$ J in metals, we have for $\eta<1$: $NEP^{eq}_{g-r}$<~$2.5\times10^{-19}$ W/Hz$^{1/2}$. The thermal fluctuation (phonon) noise-limited noise equivalent power $NEP_{ph}=\sqrt{4\eta k_B T^2 G}$ yields $NEP_{ph}$<~$10^{-14}$ W/Hz$^{1/2}$ (at T=5 K). Thus in the superconducting thermal detector (bolometer) phonon noise greatly dominates over generation-recombination noise. Also, with typical device parameters NEP contribution of the thermal noise due to the losses in the superconductor (finite quality factor of the resonant circuit) is few orders of magnitude lower than $NEP_{ph}$. Thus, a superconducting thermal detector operates in the phonon noise limit. The noise equivalent power background-limited performance $NEP_{BLIP}$ for the detector at 350 GHz is about ~$10^{-15}$ W/Hz$^{1/2}$ for a single mode assuming quantum efficiency of unity for the 300 K black-body object emitting radiation in a 100 GHz bandwidth. The NEP contributions with dissipative readout for a superconducting thermal detector (bolometer) are plotted in FIG. 4 with detector parameters as explained in the description of FIG. 4.

For a microwave read-out of a superconducting thermal detector (bolometer), the superconducting meander line with temperature dependent inductance L(T) is connected to the shunting capacitor $C_{sh}$ to form a resonant tank circuit, which is in turn coupled to the read-out superconducting transmission line through the coupling capacitor $C_c$ (FIG. 3). With typical value for thermal conductance of micro-suspensions G~100 nW/K and linear dimensions of a superconducting inductor said above, the detector responsivity then yields dV/dP~$10^5$ V/W. A low noise amplifier is used to readout bolometer signal.

The multiplexed arrays of superconducting thermal detectors (multiplexed pixels) represent a 2D matrix of resonant tank circuits (pixels) with alternated values of shunting capacitances in each of the resonant tank circuit (in each pixel), so that each resonant frequency is in one-to-one correspondence to a single pixel. The pixels are capacitively coupled to a superconducting transmission line for a multiplexed microwave readout of a 2D bolometer pixel array. The optimal geometry design of the said bolometer arrays is implemented to eliminate electrical cross-talk between the pixels.

Proof-of-Principle Validation

As shown in FIG. 2A-2B a superconducting thermal detector (bolometer) comprises the micro-structure consisting of the following parts:

1) An absorption part consisting of a resistive film 1 which absorbs THz radiation.

2) A temperature detecting part consisting of a superconducting thin film forming the inductor 2.

3) A resonant circuit consisting of the inductor 2 formed by the said superconducting film and a shunting thin film capacitor Csh, coupled to a superconducting transmission line.

4) A back reflector 10 attached at the bottom of the Si chip and forming $\lambda/4$ optical cavity 9 for enhanced THz absorption (FIG. 2B).

The superconducting thermal detectors (bolometers) and arrays of those have been successfully fabricated and tested. The experimental data shown in FIG. 5 demonstrates a multiplexed 8-pixel bolometer array measured at a reduced temperature $T/T_C$=0.9 with $T_C$~4 K.

The measured temperature dependence of the resonant frequency is shown in FIG. 6. In FIG. 7 we show temperature dependence of kinetic inductance the deduced from data in FIG. 6 (circles). The solid lines are the fits according to two-fluid model $L_k=L_k(0)/(1-(T/T_C)^4)$ with critical temperature $T_C$=4.03 K and magnetic penetration depth $\lambda(0)$=626 nm.

DESCRIPTION OF FIGURES

The following reference numbers will be used in connection with the following terms:

1 absorbing element
2 superconducting inductor
3 substrate
4 read-out circuit
5 membrane layer
6 superconducting inductor layer (1$^{st}$ superconducting electrode)
7 insulator layer
8 2$^{nd}$ superconducting layer (2$^{nd}$ superconducting electrode)
9 optical cavity
10 back reflector
11 micro-suspensions
21 membrane perforations
Csh shunting thin film capacitor The features of the invention can be understood with reference to the drawings and the graphs described below, and the claims. The drawings are not necessarily to scale, emphasizing instead the principles and key features of the invention. In the drawings, numerals are used to indicate throughout the views.

In the following, the invention is examined with the aid of examples and with reference to the accompanying drawings.

Figure 1:
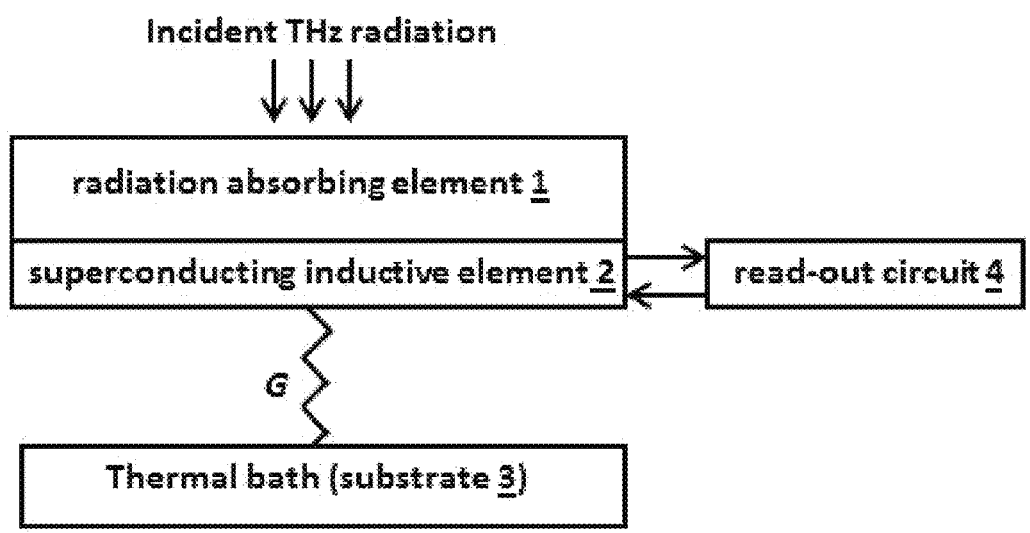

FIG. 1 shows a general principle scheme of THz radiation detection with a superconducting thermal detector using the inductance in accordance with the invention.

FIGS. 2A-2B show a schematic cross-section of thin film multi-layered structure of a superconducting thermal detector (bolometer) in accordance with the invention.

Figure 3:
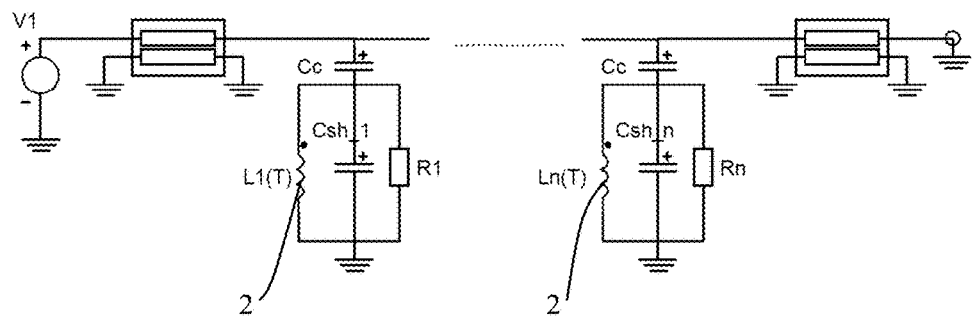

FIG. 3 shows an equivalent electrical circuit of an array of N superconducting thermal detectors (bolometers) capacitively coupled to a superconducting transmission line in accordance with the invention.

Figure 4:
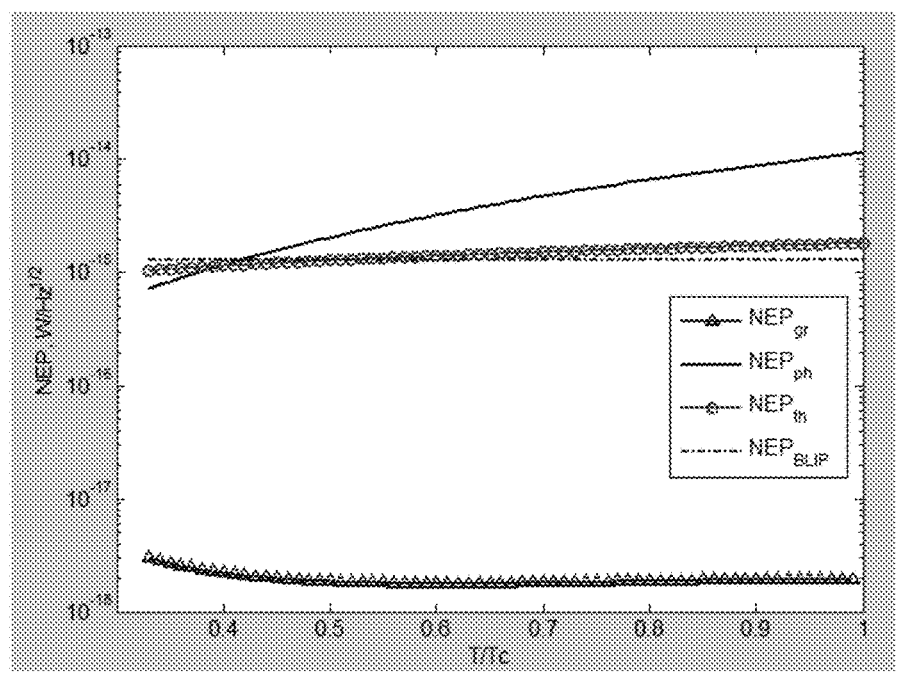

FIG. 4 shows a graph of calculated noise-equivalent power (NEP) contributions with optical efficiency of unity for a superconducting thermal detector (bolometer) in accordance with the invention at reduced temperatures $T/T_C = 0.3 \ldots 1$.

Figure 5:
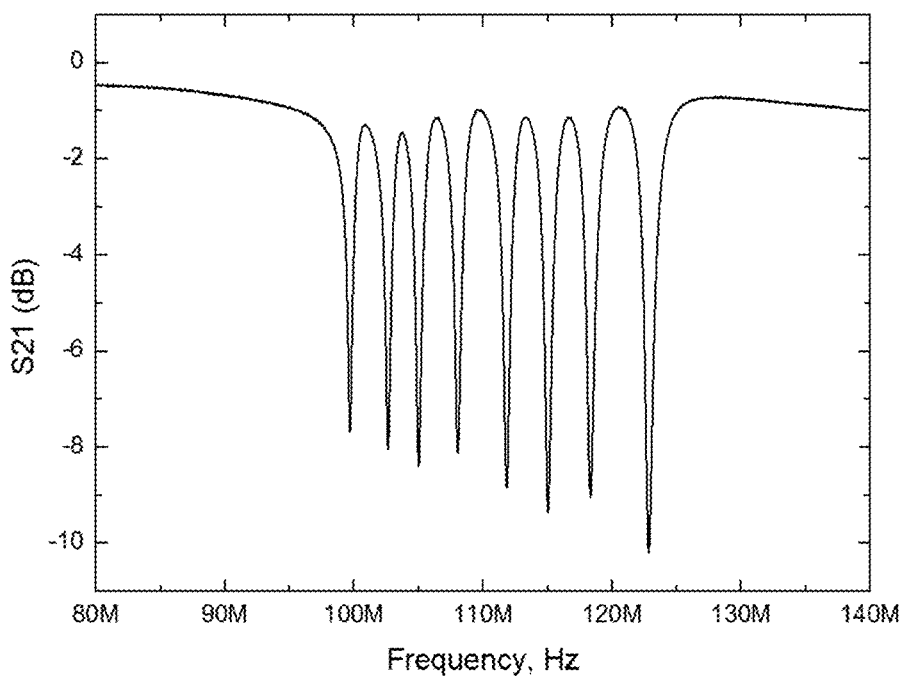

FIG. 5 shows a graph of measured transmission S21 parameter in decibels for 8-pixel array of superconducting thermal detectors (bolometers) in accordance with the invention at a reduced temperature $T/T_C = 0.9$.

Figure 6:
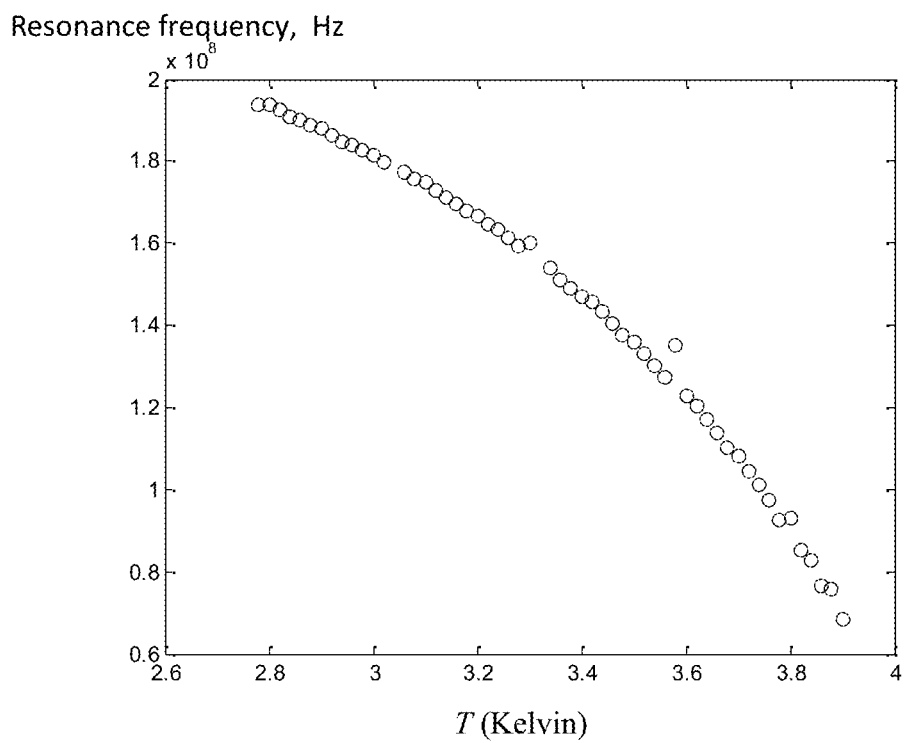

FIG. 6 shows a graph of measured temperature dependence of the lowest frequency resonance in the 8-pixel array of superconducting thermal detectors (bolometers) in accordance with the invention.

Figure 7:
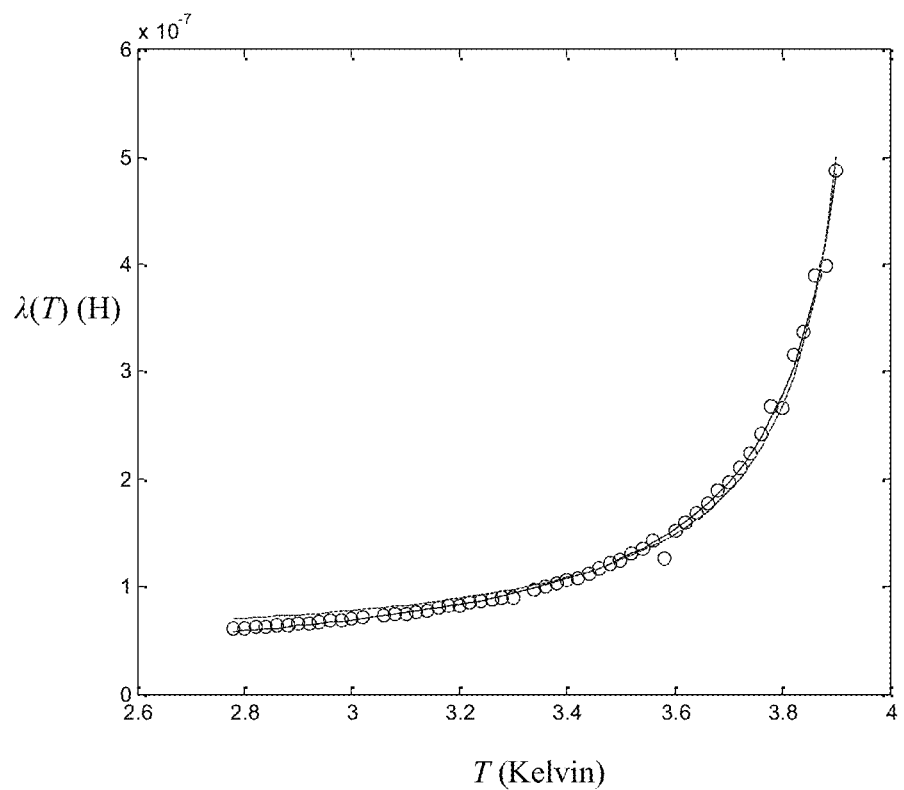

FIG. 7 shows a graph of deduced from data in FIG. 6 temperature dependence of magnetic penetration length of the superconducting inductor of the superconducting thermal detector (bolometer) in accordance with the invention.

DETAILED DESCRIPTION OF FIGURES

FIG. 1 shows general principle scheme of THz radiation detection with a superconducting thermal detector using the superconducting inductance. The incoming radiation is absorbed by the absorbing element 1 which is in a tight thermal contact with a superconducting inductor 2. The superconducting inductor is thermally isolated from the thermal bath (substrate) by micro-suspension legs, whose total thermal conductance is denoted by G. The signal is detected by the read-out circuit 4.

FIG. 2A shows a schematic cross-section of multi-layer structure of a superconducting thermal detector (bolometer). The detector is micro-machined using standard thin film deposition and micro-lithography methods. The substrate 3 represents a silicon wafer. Deposited thin films on top of the silicon substrate are: $1^{st}$ layer is a silicon etch-stop layer (optional in the process), $2^{nd}$ layer is a membrane layer 5, $3^{rd}$ layer is a superconducting inductor layer 2 and $1^{st}$, $4^{th}$ layer is an insulating layer (dielectric) 7, $5^{th}$ layer is a superconducting layer 8 (optional in the process). The perforations 21 (optional in the process) in the membrane layer 5 are applied to form narrow micro-suspension legs for thermal insulation. The deep silicon etch through the substrate 3 is applied to form resonant optical $\lambda/4$ cavity 9.

FIG. 2B shows the superconducting thermal detector (bolometer) as in FIG. 1 with an etched resonant optical $\lambda/4$ cavity 9 and a back reflector 10 to enhance optical absorptivity.

FIG. 3 shows an equivalent electrical circuit of an array of N superconducting thermal detectors (bolometers) capacitively coupled to a superconducting transmission line. Each pixel represents an inductance $L_i(T)$ embedded into a resonant circuit with the shunting capacitor $C_{sh\_i}$, where "i" denotes the number of the $i^{th}$ bolometer pixel. The microwave losses of each inductor are depicted with resistor R.

FIG. 4 shows a calculated noise-equivalent power (NEP) contributions for a superconducting thermal detector (bolometer) at reduced temperatures $T/T_C = 0.3 \ldots 1$ assuming unity for optical efficiency: NEP of phonon noise (solid line), thermal noise (circles), generation-recombination noise (triangles), and the background limited noise level of a blackbody with temperature 300 K in an optical bandwidth 100 GHz (dash-dotted line). The thermal conductance of micro-suspensions is assumed to be temperature dependent as $G(T) = 50$ nW/K*$(T/T_C)^3$ assuming temperature dependent lattice thermal isolation $T^3$ of an insulating material of microsuspensions [Ref. 12].

FIG. 5 shows measured transmission S21 parameter in decibels for 8-pixel array of superconducting thermal detectors (bolometers) at a reduced temperature $T/T_C = 0.9$. The quality factor of the resonators is about 300.

FIG. 6 shows measured temperature dependence of the lowest frequency resonance in the 8-pixel array of superconducting thermal detectors (bolometers).

FIG. 7 shows deduced from data in FIG. 5 temperature dependence of magnetic penetration length of the superconducting inductor of the superconducting thermal detector (bolometer).

Some preferred embodiments of the invention are listed in the following paragraphs:

Manufacturing Method of Superconducting Thermal Detector (Bolometer) of Terahertz (Sub-millimeter) Wave Radiation in Accordance with the Invention In the following, manufacturing method of a superconducting thermal detector (bolometer) of the present invention is explained with reference to FIG. 2A-2B with the same reference numerals as earlier.

The typical manufacturing process of a superconducting thermal detector (bolometer) includes the following microfabrication steps of thin film depositions and microlithography patterning methods:

1. Deposition of etch-stop layer such as silicon oxide or onto a silicon substrate 3 (optional step).
2. Deposition of the membrane layer 5 onto the silicon substrate 3. The membrane layer comprises a 100 nm to 1 µm thick film of a material such as a silicon nitride (SiN, $Si_3N_4$), a silicon oxide (SiO, $SiO_2$), or other-like materials used to form membranes.
3. Deposition of superconducting inductor layer 6 is done by sputtering method in argon atmosphere. The superconducting inductor comprises a 3 nm to 500 nm thick film of a superconducting material such as niobium (Nb), niobium nitride (NbN) or niobium titanium nitride (NbTiN). The material of superconducting inductor layer 6 is not limited to Nb, NbN, or NbTiN, and other superconducting materials such as aluminium (Al), vanadium (V), vanadium nitride (VN), tungsten silicide (WSi), magnesium diboride ($MgB_2$) and other-like can be used. The superconducting inductor layer 6 is patterned by micro-lithography and by wet etching or by plasma etching.
4. Deposition of insulator layer 7. The insulator layer 7 material comprises a 10 nm to 1 µm thick film of silicon nitride (SiN, $Si_3N_4$), a silicon oxide (SiO, $SiO_2$), aluminium oxide (AlO, $Al_2O_3$), or other-like insulator materials. The insulator layer 7 is patterned by microlithography and by wet etching or by plasma etching.
5. (Optional step) Deposition of $2^{nd}$ superconducting layer 8 comprising a 3 nm to 1 µm thick film comprising any of superconducting materials listed in the step 3 of deposition of superconducting inductor layer 6. The $2^{nd}$ superconducting layer 8 is patterned by micro-lithography and by wet etching or by plasma etching.

6. Deposition of absorber layer followed by wet etching or by dry etching to form absorbing element 1. The material of an absorbing element 1 comprises a normal metal 100 nm thick film of titanium tungsten (TiW). The material of absorbing element 1 is not limited to TiW, and other metallic materials such as Mo, Ti and the like can be used to form the absorbing element 1.
7. (Optional step). Forming membrane perforations 21 and micro-suspension legs 11 to enhance thermal isolation of a superconducting inductor 2 or/and absorbing element 1. The perforations 21 in the membrane layer 5 are patterned by micro-lithography and by wet etching or by plasma etching.
8. Deep etching of silicon to release the membrane layer 5 by anisotropic silicon ICP etching or by wet etching. To enhance absorption of THz radiation, an optical cavity 9 of a gap of $\lambda/4$ or odd multiples of $\lambda/4$: $(2n+1)\lambda/4$, $(n=1,2, \ldots)$ can be formed between an absorbing element 1 and the attached back reflector 10. To form $\lambda/4 \sim 214$ µm or $3\lambda/4 \sim 643$ µm or optical cavity (the wavelength $\lambda \sim 857$ µm for incoming 350 GHz radiation) the silicon wafer substrates 3 with corresponding approximate thicknesses of $\lambda/4$ and $3\lambda/4$ are used in the microfabrication process of a superconducting thermal detector (bolometer). A back reflector 10 can comprise a reflective surface or a reflective film deposited onto another substrate, which are attached to the substrate 3.
9. (Optional step). Removing etch-stop silicon oxide layer in a buffered HF solution or in a dry HF vapour etcher.

Some preferred embodiments of the invention are listed in the following paragraphs:

1) A superconducting thermal detector (bolometer) where the thermometry is carried out by sensing the change in the amplitude or phase of a resonator circuit, consisting of a capacitor and a superconducting inductor where the said superconducting inductor is thermally isolated from the heat bath of the system.
2) A superconducting thermal detector (bolometer) described in paragraph 1) where the inductor phonon system is located on the membrane thermally isolated from the phonon system of the lattice by micro-suspensions.
3) A superconducting thermal detector (bolometer) of paragraph 1), wherein the said inductor comprises a superconducting material having a high normal state resistivity.
4) A superconducting thermal detector (bolometer) of paragraph 1), wherein the said superconducting inductor comprises a superconducting material such as aluminium (Al), Niobium (Nb), Vanadium (V), Tungsten silicide (WSi), Magnesium diboride ($MgB_2$), and other-like superconducting materials.

A superconducting thermal detector (bolometer) of paragraph 1), wherein the said superconducting inductor comprises a superconducting material comprising nitrogen (N) and a metal selected form the group consisting of Niobium (Nb), Titanium (Ti) and Vanadium (V).

5) A superconducting thermal detector (bolometer) utilizing kinetic inductance thermometry which is read out by a scattering parameter measurement which can be used to determine the amplitude or phase change in the resonator induced by impinging optical power.

6) A superconducting thermal detector (bolometer) of paragraph 1) which utilizes kinetic inductance thermometry and incorporates an impedance matching surface for efficient absorption of incident optical power.
7) A superconducting thermal detector (bolometer) of paragraph 1) which utilizes kinetic inductance thermometry and incorporates an antenna and an antenna termination which dissipates the incident radiation power and translates it to heat to be sensed by the kinetic inductance thermometer.
8) The read-out circuit of incident THz radiation signal that is implemented by sensing microwave transmission/reflection parameters via a superconducting transmission line to which the said superconducting thermal detector (bolometer) of any of paragraphs 1) to 7) is coupled either via a capacitance or via an inductance or via a circuit containing both an inductance and a capacitance. The bolometer array circuit comprising linear or 2-dimensional matrix of superconducting thermal detectors (bolometers) consists of individual bolometer resonant circuits with different resonant frequencies coupled to a superconducting transmission line via a capacitance or via an inductance or via a circuit containing both inductive and a capacitive elements.

Disclaimer

Although the theoretical description described herein is thought to be correct, the operation of the devices/detectors described here does not depend upon the accuracy or validity of the theoretical description. That is, latter theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between the incorporated material and the present disclosure material. In the event of a conflict, the conflict has to be resolved in favour of present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

Cited Patent Document

D. G. McDonald, U.S. Pat. No. 4,869,598, issued Sep. 26, 1989.

REFERENCES AND RELATED LITERATURE

[1] D. H. Andrews, Yearbook Am. Philos. Soc. (1938), 132. A. Goetz, Phys. Rev. 55, 1270, 1939. D. H. Andrews et al., Phys. Rev. 59, 1045, 1941.
[2] D. G. McDonald, Applied Physics Letters, Vol. 50, p. 775, 1987. D. G. McDonald, IEEE Trans. on Magnetics, Vol. 25, No. 2, 1989.
[3] E. N. Grossman, D. G. McDonald and J. E. Sauvageau, IEEE Trans. On Magnetics, Vol. 27, No. 2, March 1991, 2677-2680; 2757-2760.
[4] P. K. Day et al., Nature, Vol. 425, p. 817, 2003.
[5] R. Barends, Ph.D. thesis, Delft University of Technology, 2009.

[6] S. Doyle et al, 32$^{nd}$ International Conference on Infrared and Millimeter Waves IRMMW-THz, pp. 450-451, 2007.
[7] Jonas Zmuidzinas, Ann. Rev. Condens. Matter Phys. 2012. 3:169-214.
[8] NIKA: A millimeter-wave kinetic inductance camera, A. Monfardini et al., Astronomy and Physics, Vol 521, October 2010.
[9] MAKO: a pathfinder instrument for on-sky demonstration of low-cost 350 micron imaging arrays, Loren J. Swenson et al, Proc. SPIE 8452, Millimeter, Submillimeter, and Far-Infrared Detectors and Instrumentation for Astronomy VI, 84520P (Sep. 24, 2012); doi:10.1117/12.926223.
[10] MUSICA: (MUltiband Submillimeter Inductance Camera), http://microdevices.jpl.nasa.govicapabilities/superconducting-devices/MUSIC.php.
[11] Dual-polarization sensitive MKIDs for far-infrared astrophysics, J. Hubmayr et al, ASC 2012 Conference on Applied Superconductivity, talk 5EB-06.
[12] F. Giazotto et al. "Opportunities for mesoscopics in thermometry and refrigeration: physics and applications", Rev. Mod. Phys. 78, 217-274 (2006).
[13] N. Vercruyssen et al., Appl. Phys. Lett. 99, 062509 (2011).

What is claimed is:
1. A superconducting thermal detector comprising:
a. an absorbing element for absorbing electromagnetic radiation,
b. a membrane on a silicon substrate,
c. a superconducting inductive element thermally isolated from the substrate and in thermal contact with the absorbing element, and
d. a read-out circuit for indicating the absorbed electromagnetic radiation,
e. wherein the superconducting inductive element is thermally isolated from the substrate by insulator layer micro-suspensions,
f. wherein the superconducting inductive element is electrically connected to a capacitor in order to form a resonator circuit, and
g. wherein the read-out circuit is implemented by sensing the change in amplitude and/or phase of the resonator circuit.

2. The superconducting thermal detector in accordance with claim 1, wherein a superconducting inductor phonon system is located on the membrane, whereas the said membrane is thermally isolated from the phonon system of the substrate by micro-suspensions.

3. The superconducting thermal detector in accordance with claim 1, wherein the said superconducting inductive element comprises a superconducting material having a high normal state resistivity.

4. The superconducting thermal detector in accordance with claim 1, wherein the said superconducting inductor comprises a superconducting material such as Aluminium (Al), Niobium (Nb), Vanadium (V), Tungsten silicide (WSi), Magnesium diboride ($MgB_2$) or superconducting material having superconducting transition temperatures in temperature range 1 Kelvin-20 Kelvin.

5. The superconducting thermal detector in accordance with claim 1, wherein the said superconducting inductor comprises a superconducting material comprising nitrogen (N) and a metal selected form the group consisting of Niobium (Nb), Titanium (Ti) and Vanadium (V).

6. The superconducting thermal detector in accordance with claim 1, further comprising utilizing kinetic inductance thermometry which is read out by a scattering parameter measurement which can be used to determine the amplitude or phase change in the resonator induced by impinging optical power.

7. The superconducting thermal detector in accordance with claim 1, wherein it utilizes kinetic inductance thermometry and incorporates an impedance matching surface for efficient absorption of incident optical power.

8. The superconducting thermal detector in accordance with claim 1, wherein it utilizes kinetic inductance thermometry and incorporates an antenna and an antenna termination which dissipates the incident optical power and translates it to heat to be sensed by the kinetic inductance thermometer.

9. A bolometer array comprising linear or 2-dimensional matrix of superconducting thermal detectors having individual bolometer resonant circuits with different resonant frequencies coupled to a superconducting transmission line by either via a capacitance or via an inductance or via a circuit containing both inductive and capacitive elements, wherein each superconducting thermal detector has; an absorbing element for absorbing electromagnetic radiation, superconducting inductive element which is located on a membrane and thermally isolated from a substrate and in thermal contact with the absorbing element, and a read-out circuit for indicating the absorbed electromagnetic radiation, wherein the superconducting inductive element is thermally isolated from the substrate by insulator layer micro-suspensions, wherein the superconducting inductive element is electrically connected to a capacitor in order to form a resonator circuit, and wherein the read-out circuit is implemented by sensing the change in amplitude and/or phase of the resonator circuit.

* * * * *